US012660585B2

(12) United States Patent
Yu et al.

(10) Patent No.: US 12,660,585 B2
(45) Date of Patent: Jun. 16, 2026

(54) INTERCONNECT STRUCTURE

(71) Applicant: Taiwan Semiconductor Manufacturing Co., Ltd., Hsin-Chu (TW)

(72) Inventors: Hung-Chih Yu, Hsinchu City (TW); Chien-Mao Chen, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/196,995

(22) Filed: May 12, 2023

(65) Prior Publication Data

US 2023/0290675 A1     Sep. 14, 2023

Related U.S. Application Data

(60) Continuation of application No. 16/939,625, filed on Jul. 27, 2020, now Pat. No. 11,676,853, which is a division of application No. 15/652,699, filed on Jul. 18, 2017, now Pat. No. 10,727,111.

(51) Int. Cl.
| | |
|---|---|
| *H10W 20/00* | (2026.01) |
| *H10P 70/00* | (2026.01) |
| *H10W 20/41* | (2026.01) |
| *H10W 20/42* | (2026.01) |
| *H10W 20/44* | (2026.01) |

(52) U.S. Cl.
CPC ......... *H10W 20/081* (2026.01); *H10P 70/234* (2026.01); *H10W 20/037* (2026.01); *H10W 20/056* (2026.01); *H10W 20/083* (2026.01);
*H10W 20/089* (2026.01); *H10W 20/42* (2026.01); *H10W 20/435* (2026.01); *H10W 20/4441* (2026.01)

(58) Field of Classification Search
CPC ......... H01L 21/76814; H01L 21/02063; H01L 21/76805; H01L 21/76816; H01L 21/76849; H01L 21/76877; H01L 23/5226; H01L 23/5283; H01L 23/53257; H10W 20/081; H10W 20/037; H10W 20/056; H10W 20/083; H10W 20/089; H10W 20/42; H10W 20/435; H10W 20/4441
See application file for complete search history.

(56) References Cited

U.S. PATENT DOCUMENTS

| | | | |
|---|---|---|---|
| 6,261,950 B1 * | 7/2001 | Tobben | ............... H01L 23/5226 |
| | | | 438/626 |
| 6,589,863 B1 * | 7/2003 | Usami | ............... H01L 21/76843 |
| | | | 438/653 |
| 6,605,874 B2 | 8/2003 | Leu et al. | |
| 6,706,576 B1 | 3/2004 | Ngo et al. | |
| 7,071,564 B1 | 7/2006 | Erb et al. | |

(Continued)

*Primary Examiner* — Syed I Gheyas
(74) *Attorney, Agent, or Firm* — Harrity & Harrity, LLP

(57) ABSTRACT

A method includes: forming a first conductive structure in a first dielectric layer; forming a conductive protection structure that is coupled to at least part of the first conductive structure; forming a second dielectric layer over the first dielectric layer; forming a via hole extending through at least part of the second dielectric layer to expose a portion of the conductive protection structure; cleaning the via hole; and refilling the via hole with a conductive material to form a via structure.

20 Claims, 12 Drawing Sheets

200

(56)         References Cited

U.S. PATENT DOCUMENTS

|  |  |  |  |
|---|---|---|---|
| 8,575,019 B2 | 11/2013 | Zhao | |
| 2002/0027287 A1 | 3/2002 | Takagi et al. | |
| 2006/0163739 A1 | 7/2006 | Komai et al. | |
| 2008/0251929 A1* | 10/2008 | Kageyama | H01L 23/53295 |
|  |  |  | 257/E21.582 |
| 2009/0218691 A1* | 9/2009 | Yang | H01L 23/53238 |
|  |  |  | 438/653 |
| 2017/0098575 A1 | 4/2017 | Kesapragada et al. | |

* cited by examiner

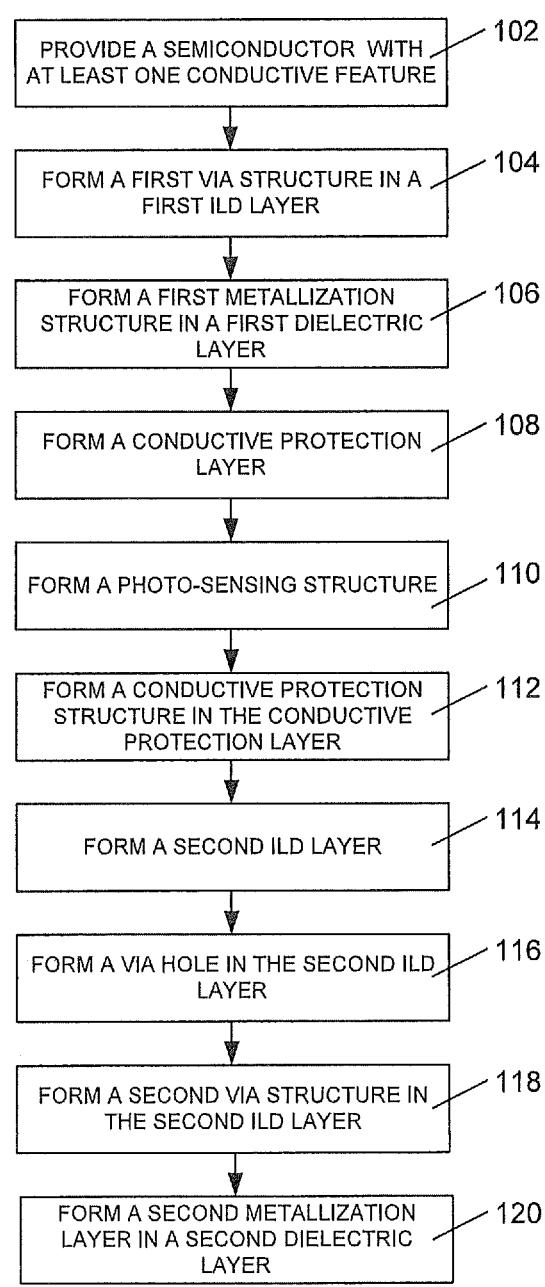

PROVIDE A SEMICONDUCTOR WITH AT LEAST ONE CONDUCTIVE FEATURE ⟋ 102

FORM A FIRST VIA STRUCTURE IN A FIRST ILD LAYER ⟋ 104

FORM A FIRST METALLIZATION STRUCTURE IN A FIRST DIELECTRIC LAYER ⟋ 106

FORM A CONDUCTIVE PROTECTION LAYER ⟋ 108

FORM A PHOTO-SENSING STRUCTURE ⟋ 110

FORM A CONDUCTIVE PROTECTION STRUCTURE IN THE CONDUCTIVE PROTECTION LAYER ⟋ 112

FORM A SECOND ILD LAYER ⟋ 114

FORM A VIA HOLE IN THE SECOND ILD LAYER ⟋ 116

FORM A SECOND VIA STRUCTURE IN THE SECOND ILD LAYER ⟋ 118

FORM A SECOND METALLIZATION LAYER IN A SECOND DIELECTRIC LAYER ⟋ 120

INTERCONNECT STRUCTURE

CROSS-REFERENCE TO RELATED APPLICATION

This application is a continuation of U.S. patent application Ser. No. 16/939,625, filed Jul. 27, 2020, which is a divisional application of U.S. patent application Ser. No. 15/652,699, filed Jul. 18, 2017, now U.S. Pat. No. 10,727,111, each of which are incorporated by reference herein in their entireties.

BACKGROUND

In accordance with advanced technologies to further scale down physical dimensions of semiconductor devices, a size of a respective interconnect line (e.g., a metallization structure) in a interconnect level (e.g., a metallization layer), coupled to the semiconductor device, tends to scale down accordingly. Furthermore, in order to connect more semiconductor devices on a wafer with a limited area, interconnect lines across various interconnect levels are electrically connected in a three-dimensional fashion by vertical conductive via structures.

In general, a via structure is typically formed by depositing a dielectric layer over a lower metallization (i.e., conductive) structure, recessing through the dielectric layer to form a vertical trench or hole, also known as a via hole, so as to expose a portion of a top surface of the lower metallization structure, and then refilling the via hole with a conductive material, e.g., metal materials. The via structure then can be used to electrically couple the lower metallization structure to one or more higher metallization structures. As such, an electrical connection path through the conductive metal material in the via hole is formed from the lower metallization structure to the higher metallization structure.

Before refilling the via hole with the metal material to form a via structure, a cleaning process is typically performed to remove residuals (e.g., polymer and/or photoresist material) distributed over the via hole, which may be induced prior to, subsequently with, or subsequent to the formation of the via hole. However, this cleaning process, which is typically based on an acid solution, may cause one or more undercuts in the lower conductive structure. Such undercuts make it relatively difficult to completely refill the via hole with the metal material during a subsequent metallization process since the undercuts create voids that remain unfilled after the metallization process. The voids formed along the electrical connection path may cause various issues, particularly when a current flows through the electrical connection path. For example, due to the presence of the void(s), an effective cross-sectional area for the current to flow may be reduced, which may in turn increase a corresponding current density. Further, continuously increasing the current density may further increase a size of the void, which may ultimately cause the electrical connection path to become an open circuit.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

FIG. 1 illustrates a flow chart of an exemplary method for forming a semiconductor device, in accordance with some embodiments.

DETAILED DESCRIPTION OF EXEMPLARY EMBODIMENTS

Figure 2A:
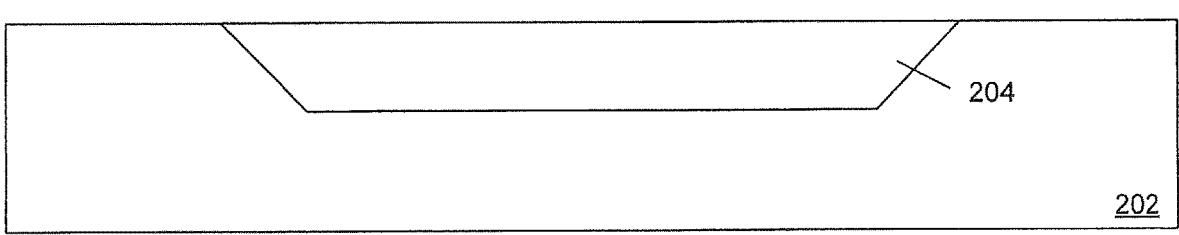
FIGS. 2A, 2B, 2C, 2D, 2E, 2F, 2G, 2H, 2I, and 2J illustrate cross-sectional views of an exemplary semiconductor device during various fabrication stages, made by the method of FIG. 1, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a semiconductor device that includes a via structure and methods of forming the same. Such a via structure allows a conductive material to pass through the via structure so as to provide a vertical electrical connection path between lower and upper horizontal metallization (i.e., conductive) structures that are disposed in respective layers, respectively, of the semiconductor device. As used herein, the term "via structure" refers to the via hole and conductive material therein (e.g., a conductive plug) that provides an electrical connection between two or more conductive structures or features on opposite sides of the via structure. In some embodiments, before forming the via structure, at least one conductive protection structure is formed on the lower horizontal metallization structure. As such, in some embodiments, when performing the above-mentioned cleaning process on a respective via hole where the via structure is to be formed, such a conductive protection structure may protect the underlying lower metallization structure from the acidic etching solution, thereby avoiding an undercut from being formed in the lower metallization structure, and thus preventing voids from being formed after refilling the via hole with the metal material. Accordingly, the above-mentioned issue may be advantageously avoided.

FIG. 1 illustrates a flowchart of a method 100 to form a semiconductor device according to one or more embodiments of the present disclosure. It is noted that the method 100 is merely an example, and is not intended to limit the present disclosure. Accordingly, it is understood that additional operations may be provided before, during, and after the method 100 of FIG. 1, and that some other operations may only be briefly described herein. In some embodiments, operations of the method 100 may be associated with cross-sectional views of a semiconductor device at various fabrication stages as shown in FIGS. 2A, 2B, 2C, 2D, 2E, 2F, 2G, 2H, 2I, and 2J, respectively, which will be discussed in further detail below.

Referring now to FIG. 1, the method 100 starts with operation 102 in which a semiconductor substrate with at least one conductive feature (e.g., a source, drain, and/or gate electrode of a transistor) is provided. The method 100 continues to operation 104 in which a first via structure is formed in a first inter-layer dielectric (ILD) layer. In some embodiments, the first via structure is configured and positioned to allow the at least one conductive feature to be electrically coupled to another conductive feature or structure through the first via structure. The method 100 continues to operation 106 in which a first metallization structure is formed in a first dielectric layer. In some embodiments, the first dielectric layer is formed over the first ILD layer. In some embodiments, the first metallization structure is electrically coupled to the first via structure. The method 100 continues to operation 108 in which a conductive protection layer is formed over the first dielectric layer. In some embodiments, the conductive protection layer is formed to prevent the above-mentioned undercuts from being formed in the first metallization structure during a later cleaning process. The method 100 continues to operation 110 in which a photo-sensing structure is formed over the conductive protection layer. In some embodiments, the photo-sensing structure is formed by performing a photolithography process on a photo-sensing layer. The method 100 continues to operation 112 in which a conductive protection structure is formed. In some embodiments, the conductive protection structure may be formed by performing one or more etching processes on the conductive protection layer while using the photo-sensing structure as a mask. In some embodiments, the conductive protection structure is aligned with the first metallization structure so that the conductive protection structure and first metallization structure are electrically coupled with each other. The method 100 continues to operation 114 in which a second ILD layer is formed. In some embodiments, the second ILD layer is formed over the conductive protection structure and the first dielectric layer. The method 100 continues to operation 116 in which a via hole is formed in the second ILD layer. The method 100 continues to operation 118 in which a second via structure is formed. The method 100 continues to operation 120 in which a second metallization structure is formed in a second dielectric layer. In some embodiments, the second dielectric layer is formed over the second ILD layer. In some embodiments, the conductive feature 204 in the substrate 202 is electrically connected to the second metallization structure 242 through the first via structure 208, the first metallization structure 212, the conductive protection structure 224, and the second via structure 238.

As mentioned above, FIGS. 2A through 2J illustrate, in a cross-sectional view, a portion of a semiconductor device 200 at various fabrication stages of the method 100 of FIG. 1. The semiconductor device 200 may be included in a microprocessor, memory cell, and/or other integrated circuit (IC). Also, FIGS. 2A through 2J are simplified for a better understanding of the concepts of the present disclosure. Although the figures illustrate the semiconductor device 200, it is understood the IC may comprise a number of other devices such as resistors, capacitors, inductors, fuses, etc., which are not shown in FIGS. 2A-2J, for purposes of clarity of illustration.

FIG. 2A is a cross-sectional view of the semiconductor device 200 including a substrate 202 with at least one conductive feature 204 at one of the various stages of fabrication corresponding to operation 102 of FIG. 1, in accordance with some embodiments. Although the semiconductor device 200 in the illustrated embodiment of FIG. 2A includes only one conductive feature (e.g., 204), it is understood that the illustrated embodiment of FIG. 2A and the following figures are merely provided for illustration purposes. Thus, the semiconductor device 200 may include any desired number of conductive features while remaining within the scope of the present disclosure.

In some embodiments, the substrate 202 includes a silicon substrate. Alternatively, the substrate 202 may include other elementary semiconductor material such as, for example, germanium. The substrate 202 may also include a compound semiconductor such as silicon carbide, gallium arsenide, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the substrate 202 also includes various p-type doped regions and/or n-type doped regions, implemented by a process such as ion implantation and/or diffusion. Those doped regions include n-well, p-well, lightly doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 202 may further include other functional features such as a resistor or a capacitor formed in and on the substrate. The substrate 202 further includes lateral isolation features provided to separate various devices formed in the substrate 202, for example shallow trench isolation (STI). The various devices in the substrate 202 further include silicide disposed on S/D, gate and other device features for reduced contact resistance and enhance process compatibility when coupled between devices through local interconnections.

In an embodiment, the conductive feature 204 can be a source, drain or gate electrode. Alternatively, the conductive feature 204 may be a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or by on source/drain (typically known as "salicide") by a self-aligned silicide technique. In another embodiment, the conductive feature 204 may include an electrode of a capacitor or one end of a resistor.

Figure 2B:
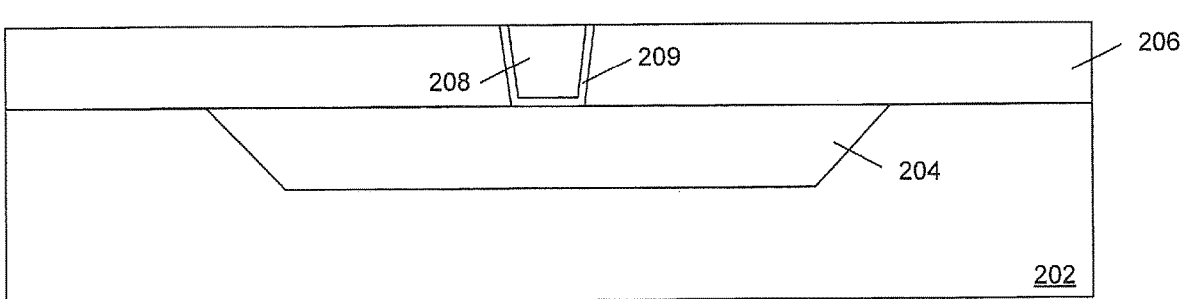

FIG. 2B is a cross-sectional view of the semiconductor device 200 including a first via structure 208 in a first inter-layer dielectric (ILD) layer 206 at one of the various stages of fabrication that corresponds to operation 104 of FIG. 1, in accordance with some embodiments. As shown, the first via structure 208 is configured to extend through the first ILD layer 206 to electrically couple itself to the conductive feature 204. Alternatively, the first via structure 208 may be a conductive plug. In some further embodiments, the semiconductor device 200 may include a first barrier layer 209 surrounding sidewalls and bottom surface of the first via structure 208.

The first ILD layer 206 includes a material that is at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. Since the material of a first ILD layer 206 will be used by other dielectric layers formed subsequently, for ease of discussion, the dielectric material is herein referred to as "material D."

In some embodiments, the first via structure 208 includes a metal material such as, for example, copper (Cu), or the like. In some other embodiments, the first via structure 208 may include other suitable metal materials (e.g., gold (Au), cobalt (Co), silver (Ag), etc.) and/or conductive materials (e.g., polysilicon) while remaining within the scope of the present disclosure. Similarly, since the material of the first via structure 208 will be used by other conductive structures formed subsequently, for ease of discussion, the metal material is herein referred to as "material M".

In some embodiments, the first barrier layer 209 includes a conductive material such as a metal, a metal alloy, or a metal nitride, for example, tantalum nitride (TaN), tantalum (Ta), titanium nitride (TiN), titanium (Ti), cobalt tungsten (CoW), tungsten nitride (WN), or the like. The first barrier layer 209 may effectively prevent metal atoms from diffusing into the first ILD layer 206 during a metal deposition process to form the first via structure 208, which will be discussed below. Similarly, since the material of the first barrier layer 209 will be used by other barrier layers formed subsequently, for ease of discussion, the material of the barrier layer 209 is herein referred to as "material B."

The first via structure 208 may be formed by at least some of the following process steps: using chemical vapor deposition (CVD), physical vapor deposition (PVD), spin-on coating, and/or other suitable techniques to deposit the material D over the substrate 202 with the conductive feature 204 to form an initial first ILD layer (the first ILD layer 206 is a remaining portion of the initial first ILD layer after the later performed patterning process); performing one or more patterning processes (e.g., a lithography process, a dry/wet etching process, a soft/hard baking process, a cleaning process, etc.) to form a via hole through the initial first ILD layer; using CVD, PVD, and/or other suitable techniques to deposit the aforementioned material B along a bottom surface and sidewalls of the via hole to surround the via hole; using CVD, PVD, E-gun, and/or other suitable techniques to fill the via hole with the material M, and polishing out excessive material M by a planarization process (e.g., chemical-mechanical polishing) to form the first via structure 208 with the first barrier layer 209.

Figure 2C:
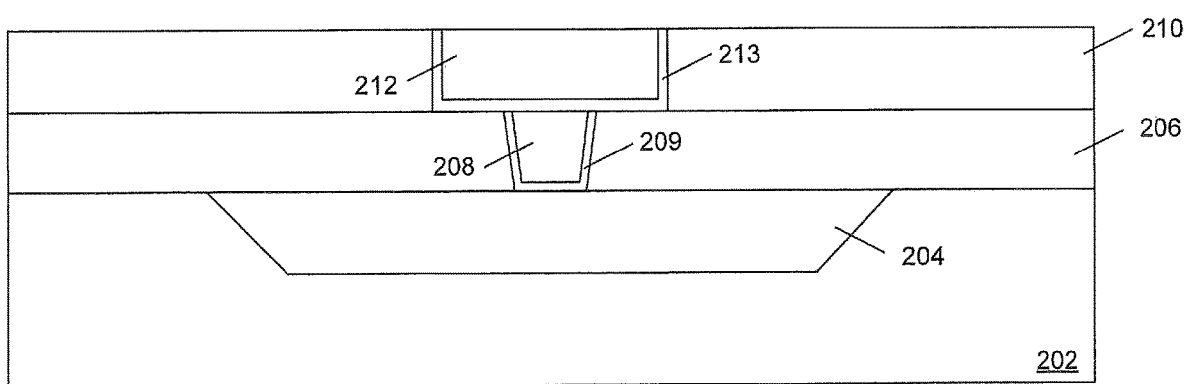

FIG. 2C is a cross-sectional view of the semiconductor device 200 including a first metallization structure 212 formed in a first dielectric layer 210 at one of the various stages of fabrication that corresponds to operation 106 of FIG. 1, in accordance with some embodiments. In some embodiments, the first dielectric layer 210 including the first metallization structure 212 is herein referred to as the "first metallization layer."

As shown, the first metallization structure 212 is coupled to the first via structure 208, and horizontally extends over a respective width in the first dielectric layer 210. In some embodiments, the first metallization structure 212 may be wider than the first via structure 208. In some further embodiments, the semiconductor device 200 may include a second barrier layer 213 surrounding sidewalls and bottom surface of the first metallization structure 212. In some alternative embodiments, the first metallization structure 212 can be directly coupled to the conductive feature 204, i.e., the first via structure 208, the first barrier layer 209, and ILD layer 206 may be optional.

In some embodiments, the first dielectric layer 210 includes the material D; the first metallization structure 212 includes the material M; and the second barrier layer 213 includes the material B. The first metallization structure 212 may be formed by at least some of the following process steps: using CVD, PVD, spin-on coating, and/or other suitable techniques to deposit the material D over the first ILD layer 206 and the first via structure 208 to form an initial first dielectric layer (the first dielectric layer 210 is a remaining portion of this initial first dielectric layer after the later performed patterning process); performing one or more patterning processes (e.g., a lithography process, a dry/wet etching process, a soft/hard baking process, a cleaning process, etc.) to form an opening through the initial first dielectric layer; using CVD, PVD, and/or other suitable techniques to deposit the aforementioned material B to surround the opening; using CVD, PVD, E-gun, and/or other suitable techniques to fill the opening with the material M, and polishing out excessive material M by a planarization process (e.g., chemical-mechanical polishing) polishing to form the first metallization structure 212 surrounded by the second barrier layer 213.

Figure 2D:
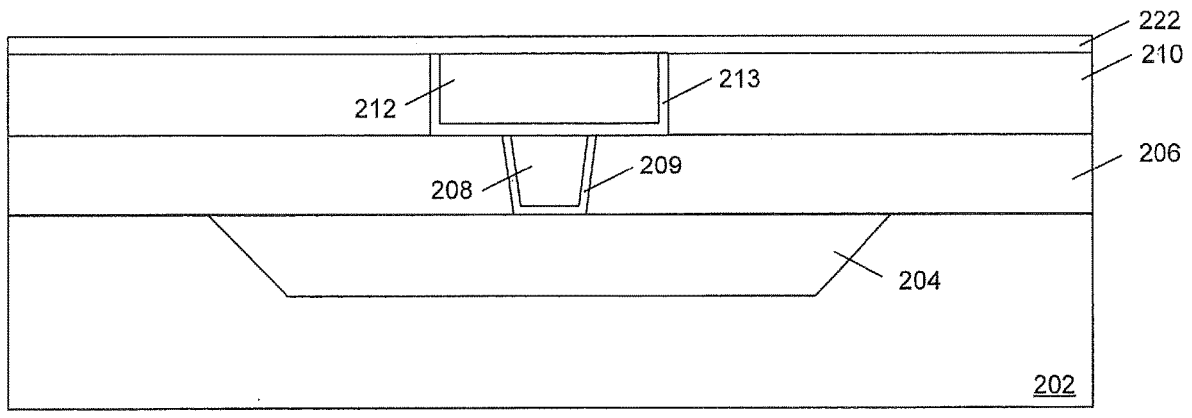

FIG. 2D is a cross-sectional view of the semiconductor device 200 including a conductive protection layer 222 formed over the first dielectric layer 210 and the first metallization structure 212 at one of the various stages of fabrication that corresponds to operation 108 of FIG. 1, in accordance with some embodiments. In some embodiments, the conductive protection layer 222 may be a substantially flat layer. In some embodiments, the conductive protection layer 222 may be formed from a conductive material such as, for example, tungsten (W), or the like. The conductive protection layer 222 may be formed by using CVD, PVD, spin-on coating, and/or other suitable techniques to deposit the above-mentioned conductive material (e.g., W) over the first dielectric layer 210 and the first metallization structure 212.

Figure 2E:
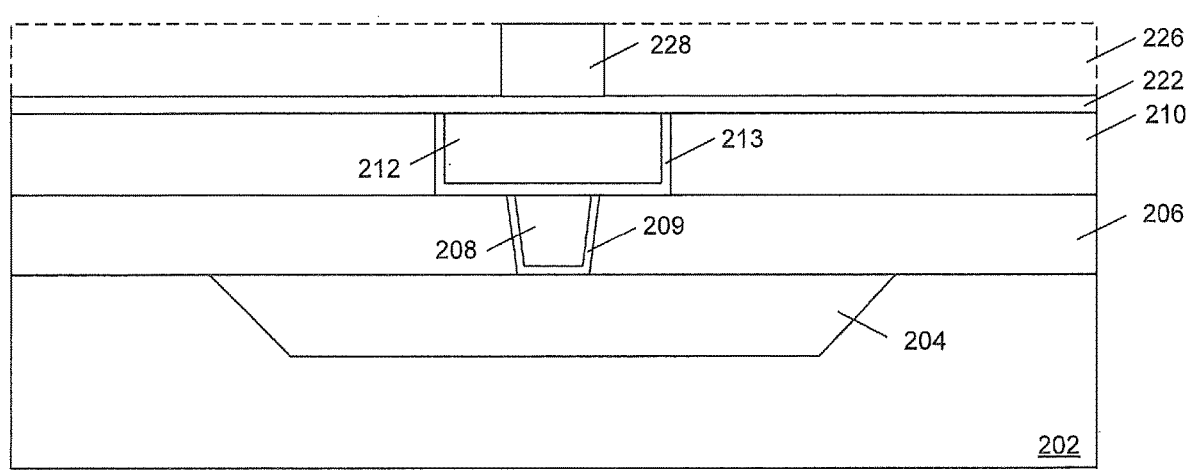

FIG. 2E is a cross-sectional view of the semiconductor device 200 including a photo-sensing structure 228 at one of the various stages of fabrication that corresponds to operation 110 of FIG. 1, in accordance with some embodiments. As shown, the photo-sensing structure 228 formed on the conductive protection layer 222, may be a remaining portion of an initial photo-sensing layer 226 after one or more patterning (e.g., photolithography) processes. The removed portion of the initial photo-sensing layer 226 is indicated by a dashed line to differentiate from the remaining structures on top of the semiconductor device 200 for purposes of clarity of illustration. As will be described below, the photo-sensing structure 228 is used to mask the conductive protection layer 222 so as to form a conductive protection structure. Accordingly, in some embodiments, the photo-sensing structure 228 is formed to align with at least part of the first metallization structure 212 so as to allow one or more later formed conductive features to be electrically couple to the first metallization structure 212 through the later formed conductive protection structure.

In some embodiments, the initial photo-sensing layer 226 may include a negative or positive tone photoresist layer that is patternable in response to a photolithography light source. In some alternative embodiments, the initial photo-sensing layer 226 may include an e-beam (electron beam) resist layer (e.g., poly methyl methacrylate, methyl methacrylate, etc.) that is patternable in response to an e-beam lithography energy source. In some embodiments, the initial photo-sensing layer 226 is formed over the conductive protection layer 222 using a deposition process known in the art such as spin-coating, spray-coating, dip-coating, roller-coating, or the like. The photoresist material is then patterned in a lithography process that may involve various exposure, developing, baking, stripping, etching, and rinsing processes. As a result, the photo-sensing structure 228 is formed.

Figure 2F:
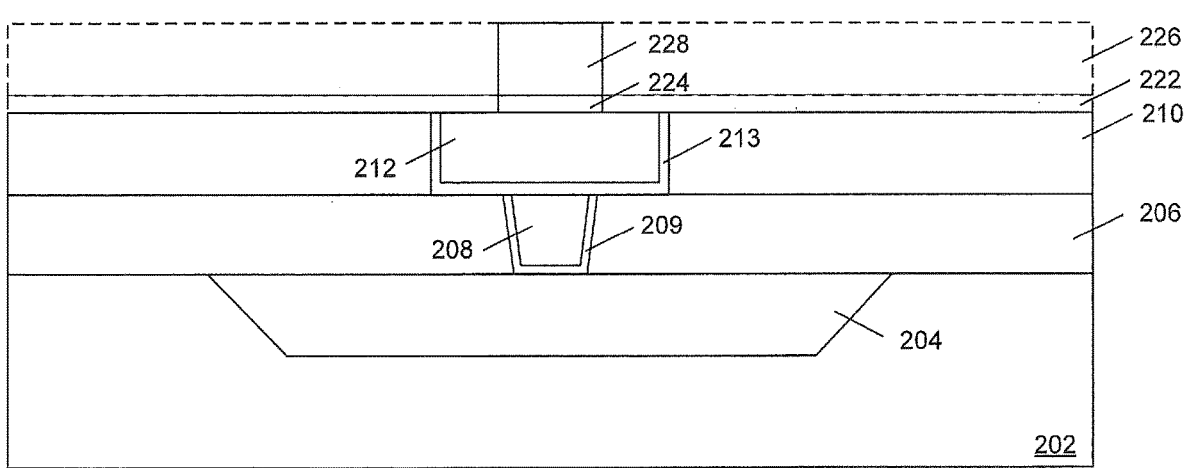

FIG. 2F is a cross-sectional view of the semiconductor device 200 including a conductive protection structure 224, which is formed at one of the various stages of fabrication that corresponds to operation 112 of FIG. 1, in accordance with some embodiments. As shown, the conductive protection structure 224 formed on the first metallization structure 212, may be a remaining portion of the initial conductive protection layer 222 after one or more etching processes. The removed portion of the initial conductive protection layer 222 is indicated by a dashed line to differentiate from the remaining structures on top of the semiconductor device 200 for purposes of clarity of illustration.

In some embodiments, the conductive protection structure 224 may be formed by performing one or more dry etching processes to remove (e.g., etch) a portion of the initial conductive protection layer 222 that is not masked by the photo-sensing structure 228. As such, in accordance with some embodiments, the conductive protection structure 224 may be formed as a substantially flat structure (since the conductive protection layer 222 is substantially flat). In some embodiments, each of the one or more dry etching processes may include using at least one etchant gas selected from: tetrafluoromethane ($CF_4$), fluoroform ($CHF_3$), difluoromethane ($CH_2F_2$), octafluorocyclobutane ($C_4F_8$), argon (Ar), and oxygen ($O_2$).

In some embodiments, after the one or more dry etching processes, the photo-sensing structure 228 may be removed by one or more chemical cleaning processes using acetone, 1-Methyl-2-pyrrolidon (NMP), Dimethyl sulfoxide (DMSO), or other suitable removing chemicals. In some embodiments, the chemicals used may need to be heated to temperatures higher than room temperature to effectively dissolve the photo-sensing structure 228. The selection of the remover is determined by the type and chemical structure of the photo-sensing layer 228, the first metallization structure 212, the first dielectric layer 210, as well as the substrate to assure the chemical compatibility of these layers with the chemical cleaning process. In some embodiments, this cleaning process is then followed by a rinsing process using isopropyl alcohol or the like, followed by rinsing using deionized water.

As mentioned above, since the photo-sensing structure 228 is formed to align with at least part of the first metallization structure 212, the conductive protection structure 224 can be formed as an intermediate conductive structure to allow the first metallization structure 212 to be electrically coupled by one or more later formed conductive features after the photo-sensing structure 228 has been removed, as described above. Further in some embodiments, the photo-sensing structure 228 may be narrower than the first metallization structure 212 and the conductive protection structure 224 remained from the dry etching process under the photo-sensing structure 228 may be narrower than the first metallization structure 212, which will be discussed in further detail below.

Figure 2G:
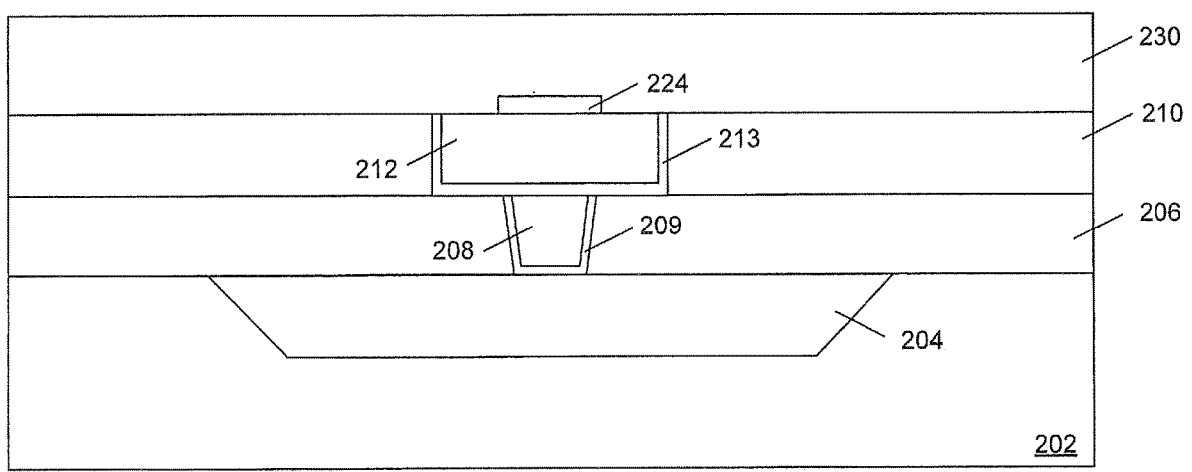

FIG. 2G is a cross-sectional view of the semiconductor device 200 including a second ILD layer 230 over the conductive protection structure 224, the first dielectric layer 210, and the first metallization structure 212 at one of the various stages of fabrication that corresponds to operation 114 of FIG. 1. The second ILD layer 230 includes the material D similar to the one used in the first ILD layer 206, which can be formed using chemical vapor deposition (CVD), physical vapor deposition (PVD), spin-on coating, and/or other suitable techniques.

Figure 2H:
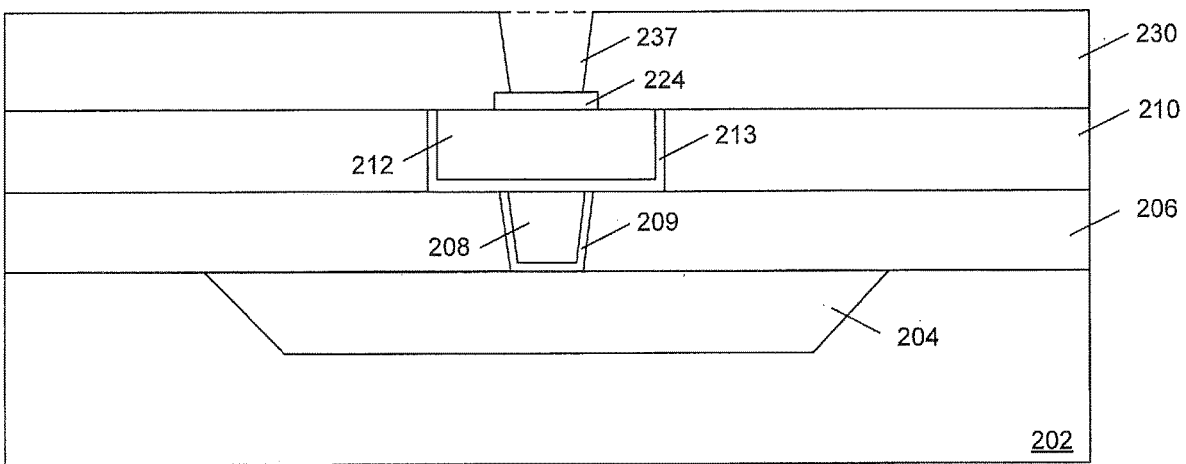

FIG. 2H is a cross-sectional view of the semiconductor device 200 including a via hole 237 formed in the second ILD layer 230 at one of the various stages of fabrication that corresponds to operation 116 of FIG. 1, in accordance with some embodiments. In some embodiments, the via hole 237 may be formed by performing one or more patterning processes (e.g., a lithography process, a soft/hard baking process, a dry/wet etching process, etc.) to form an opening through the initial second ILD layer 230.

As mentioned above, in some embodiments, prior to refilling the via hole 237 with a conductive material (e.g., the material M) so as to form a respective via structure, the via hole 237 may be cleaned by a wet chemical etch process using at least one or a combination of the following chemicals: sulfuric acid, nitric acid, chloric acid, hydrogen peroxide, etc., each of which may be dissolved in deionized water. In some embodiments, the conductive protection structure 224 has a higher etch resistance against the chemicals used in the cleaning solution than the etch resistance of the material M used in the first metallization structure 212 so that the conductive protection structure 224 may prevent the above-mentioned undercuts from being formed in the first metallization structure 212 when cleaning the via hole 237, and further prevent the above-mentioned void from being formed when the via hole 237 is refilled.

Figure 2I:
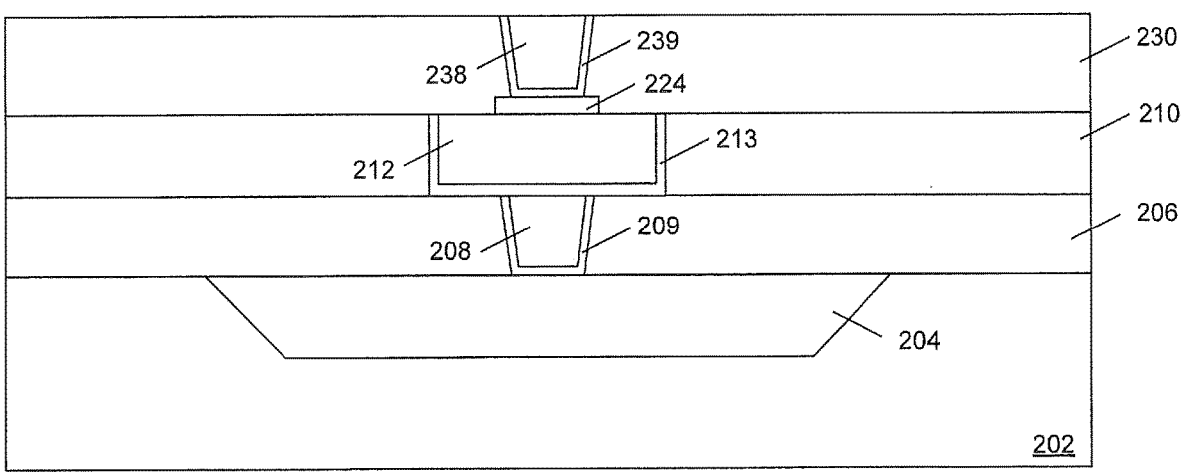

FIG. 2I is a cross-sectional view of the semiconductor device 200 including a second via structure 238 formed in the second ILD layer 230 at one of the various stages of fabrication that corresponds to operation 118 of FIG. 1, in accordance with some embodiments. As shown, the second via structure 238 extends through the second ILD layer 230 to electrically couple to the conductive protection structure 224. In some alternative embodiments, the second via structure 238 may be a conductive plug. In some further embodiments, the semiconductor device 200 may include a third barrier layer 239 surrounding sidewalls and bottom surface of the second via structure 238. As such, the second via structure 238 couples to the conductive protection structure 224 through the third barrier layer 239.

In some embodiments, the second via structure 238 also includes the material M, e.g., copper (Cu), tungsten (W), or a combination thereof, similar to the first via structure 208. In some embodiments, the third barrier layer 239 includes material B, e.g., tantalum nitride (TaN), tantalum (Ta), titanium nitride (TiN), titanium (Ti), cobalt tungsten (CoW), tungsten nitride (WN), or the like, similar to the first barrier layer 209. In some embodiments, the second via structure 238 may be narrower than the conductive protection structure 224.

The second via structure 238 may be formed by at least one combination of the following process steps: using CVD, PVD, and/or other suitable techniques to deposit the aforementioned material B along a bottom surface and sidewalls of the via hole 237 to surround the via hole 237; using CVD, PVD, E-gun, and/or other suitable techniques to fill the via hole 237 with the material M, and polishing out excessive material M by a planarization process (e.g., chemical-mechanical polishing) to form the second via structure 238 with the third barrier layer 239.

Figure 2J:
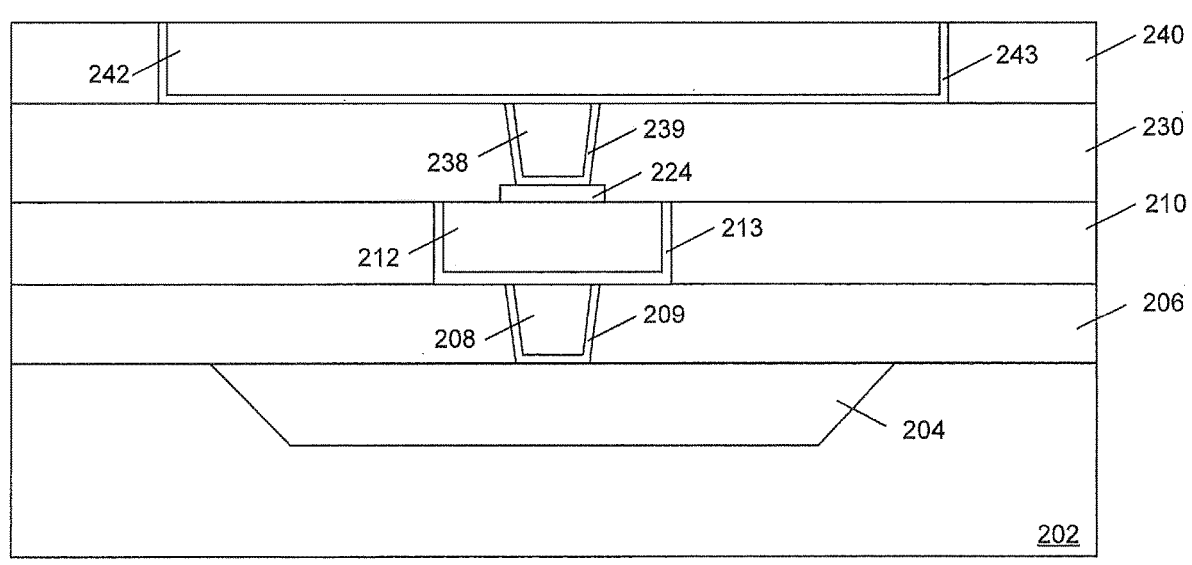

FIG. 2J is a cross-sectional view of the semiconductor device 200 including a second metallization structure 242 formed in a second dielectric layer 240 at one of the various stages of fabrication that corresponds to operation 120 of FIG. 1, in accordance with some embodiments. In some embodiments, the second dielectric layer 240 including the second metallization structures 242 is herein referred to as the "second metallization layer." In some embodiments, a fourth barrier layer 243 is formed around the second metallization structure 242 in similar fashion to the first, second and third barrier layers 209, 213 and 239, respectively, as discussed above.

In some embodiments, the second dielectric layer 240 includes the material D; the second metallization structure 242 includes the material M; and the fourth barrier layer 243 includes the material B. The second metallization structure 242 may be formed by at least some of the following process steps: using CVD, PVD, spin-on coating, and/or other suitable techniques to deposit the material D over the second ILD layer 230 and the second via structure 238 to form a second dielectric layer (the second dielectric layer 240 is a remaining portion of this initial second dielectric layer after the later performed patterning process); performing one or more patterning processes (e.g., a lithography process, a dry/wet etching process, a soft/hard baking process, a cleaning process, etc.) to form an opening through the second dielectric layer; using CVD, PVD, and/or other suitable techniques to deposit the aforementioned material B to surround the opening; using CVD, PVD, E-gun, and/or other suitable techniques to fill the opening with the material M, and polishing out excessive material M by a planarization process (e.g., chemical-mechanical polishing) to form the second metallization structure 242 with the fourth barrier layer 243.

Although the above-illustrated semiconductor device 200 (FIGS. 2A-2J) includes only two metallization layers (e.g., 210 and 236), any desired number of metallization layers can be included in the semiconductor device 200 while remaining within the scope of the present disclosure. When additional metallization layers are included in the semiconductor device 200, in order to electrically couple respective metallization structures in those additional metallization layers, a plurality of via structures may be used. It is noted that at least one conductive protection structure (e.g., 224) may be formed between one of the plurality of via structures (e.g., 238) and its corresponding lower metallization structure (e.g., 212).

As mentioned above, the second via structure 238 may be narrower than the conductive protection structure 224. Further, in some embodiments, the conductive protection structure 224 may be narrower than the first metallization structure 212. Such a geometrical relation among the first metallization structure 212, the conductive protection structure 224, and the second via structure 238 may provide various advantages. For example, when a misalignment happens during the formation of the via hole 237 (FIG. 2H), the conductive protection structure 224 that is wider than the second via structure 238 can still assure that the via hole 237, which is refilled to form the second via structure 238, is still in contact with the conductive protection structure 224.

Figure 3:
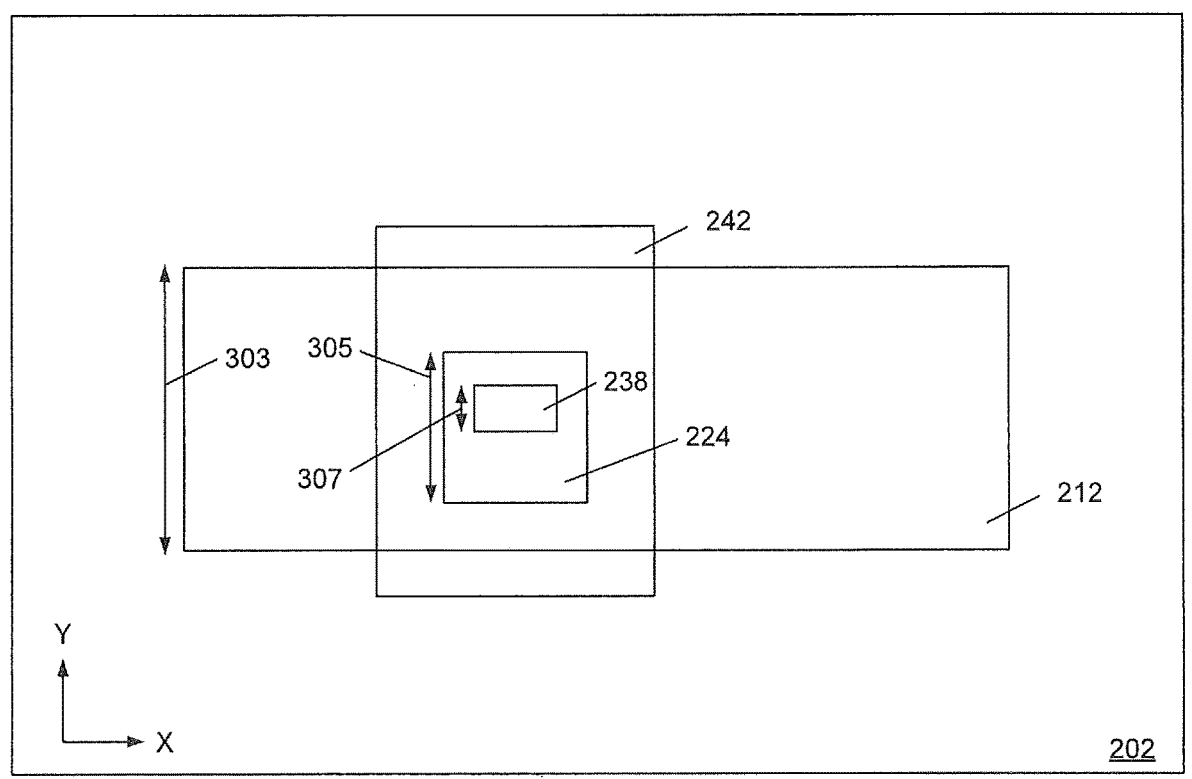
FIG. 3 illustrates a top view of the exemplary semiconductor device of FIG. 2J, in accordance with some embodiments.

FIG. 3 is an exemplary top view of the semiconductor device 200 in FIG. 2J showing such a geometrical relation, in accordance with some embodiments. As shown in FIG. 3, the first metallization structure 212 has a width 303 along the Y direction; the conductive protection structure 224 has a width 305 along the Y direction; and the second via structure 238 has a width 307 along the Y direction. In some embodiments, the dimension 307 of the second via structure 238 is smaller than the dimension 305 of the conductive protection structure 224, while the dimension 305 of the conductive protection structure 224 is smaller than the dimension 303 of the first metallization structure 212. FIG. 3 only illustrates one relative position of the second metallization structure 242, the second via structure 238, the conductive protection structure 224, and the first metallization structure 212. This is, of course, merely an example and is not intended to be limiting. For example, the conductive protection structure 224 can be at any position along the X direction and along the Y direction within the first metallization structure 212 in accordance to the position of the second via structure 238.

In an embodiment, a semiconductor device includes: first, second, and third conductive structures respectively disposed in first, second, and third dielectric layers that are on top of one another, wherein the second conductive structure is coupled between the first conductive structure and the third conductive structure; and a conductive protection structure disposed in the second dielectric layer, wherein the second conductive structure has a bottom surface completely contained within an area defined by the conductive protection structure.

In another embodiment, a method includes: forming a first conductive structure in a first dielectric layer; forming a conductive protection structure that is coupled to at least part of the first conductive structure; forming a second dielectric layer over the first dielectric layer; forming a via hole extending through at least part of the second dielectric layer to expose a portion of the conductive protection structure; cleaning the via hole; and refilling the via hole with a conductive material to form a via structure.

Yet in another embodiment, a method includes: forming a first conductive structure; forming a conductive protection structure over the first conductive structure; overlaying the first conductive structure and the conductive protection structure by a dielectric layer; recessing the dielectric layer to expose a portion of the conductive protection structure; cleaning the recessed dielectric layer; and refilling the recessed dielectric layer with a conductive material to form a via structure.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a conductive feature in a substrate;
   a first barrier layer, surrounding a first metallization structure, in a first dielectric layer that is over the substrate;
   a second barrier layer, surrounding a second metallization structure, in a second dielectric layer that is over the first dielectric layer;
   a third barrier layer, surrounding a first via structure, in a first inter-layer dielectric (ILD) layer that is between the substrate and the first dielectric layer, wherein the first via structure electrically couples the conductive feature to the first metallization structure;
   a second via structure in a second ILD layer that is between the first dielectric layer and the second dielectric layer, wherein the second ILD layer is a single layer formed of a material that is at least one of a silicon oxide or a low dielectric constant (low-k) material, wherein an entirety of a side surface of the second via structure is in direct contact with a fourth barrier layer, an entirety of a bottom surface of the second via structure is in direct contact with the fourth barrier layer, an entirety of a top surface of the second via structure is in direct contact with the second barrier layer, and an entirety of a bottom surface of the second metallization structure is in direct contact with the second barrier layer, and wherein the bottom surface of the second metallization structure is wider than the top surface of the second via structure; and a conductive protection structure in the second ILD layer between the second via structure and the first metallization structure, wherein a top surface of the first metallization structure is in contact with the conductive protection structure and the second ILD layer, wherein, from a side view of the semiconductor device, the second via structure is narrower than the conductive protective structure, and the conductive protection structure is narrower than the first metallization structure, wherein, from a top view of semiconductor device, the second via structure has a bottom surface area that is smaller than and completely contained within an area defined by a top surface of the conductive protection structure, and wherein the first metallization structure, the conductive protection structure, the first via structure, and the second via structure are vertically aligned with respect to one another and each has a width, wherein the width of the second via structure is smaller than and contained within the width of the conductive protection structure, and wherein the width of the conductive protection structure is smaller than and contained within the width of the first metallization structure.

2. The semiconductor device of claim 1, wherein the conductive feature comprises one of:

an electrode of a capacitor, or an end of a resistor.

3. The semiconductor device of claim 1, wherein the conductive protection structure is a substantially flat structure.

4. The semiconductor device of claim 1, wherein the first via structure, the second via structure, the first metallization structure, and the conductive protection structure electrically couple the second metallization structure to the conductive feature.

5. The semiconductor device of claim 1, wherein the conductive protection structure is between the bottom surface of the second via structure and the top surface of the first metallization structure.

6. The semiconductor device of claim 1, further comprising a first interlayer dielectric (ILD) layer over the conductive feature and the substrate, wherein the first ILD layer is beneath the first dielectric layer.

7. The semiconductor device of claim 6, wherein the first ILD layer includes the material that is the at least one of the silicon oxide or the low dielectric constant (low-k) material.

8. The semiconductor device of claim 1, wherein a center of the first metallization structure is aligned with a center of the second metallization structure.

9. The semiconductor device of claim 1, wherein, in the side view of the semiconductor device, the second metallization structure is wider than the first metallization structure.

10. A semiconductor device, comprising:

a conductive feature in a substrate;

a first barrier layer, surrounding a first metallization structure, in a first dielectric layer over the substrate;

a second barrier layer, surrounding a second metallization structure, in a second dielectric layer over the first dielectric layer;

a third barrier layer, surrounding a first via structure, in a first inter-layer dielectric (ILD) layer between the substrate and the first dielectric layer, wherein the first via structure electrically couples the conductive feature to the first metallization structure;

a second via structure in a second ILD layer between the first dielectric layer and the second dielectric layer, wherein the second ILD layer is a single layer formed of a material that is a silicon oxide or a low dielectric constant (low-k) material, and wherein an entirety of a side surface of the second via structure is in direct contact with a fourth barrier layer, an entirety of a bottom surface of the second via structure is in direct contact with the fourth barrier layer, an entirety of a top surface of the second via structure is in direct contact with the second barrier layer, and an entirety of a bottom surface of the second metallization structure is in direct contact with the second barrier layer, wherein the bottom surface of the second metallization structure is wider than the top surface of the second via structure; and a conductive protection structure in the second ILD layer between the first metallization structure and the second via structure, wherein a top surface of the first metallization structure is in contact with the conductive protection structure and the second ILD layer, wherein, from a side view of the semiconductor device, the second via structure is narrower than the conductive protective structure, and the conductive protection structure is narrower than the first metallization structure, wherein the conductive protection structure, the first via structure, and the second via structure are vertically aligned with respect to one another, and wherein the first metallization structure, the conductive protection structure, the first via structure, and the second via structure are vertically aligned with respect to one another and each has a width, wherein the width of the second via structure is smaller than and contained within the width of the conductive protection structure, and wherein the width of the conductive protection structure is smaller than and contained within the width of the first metallization structure.

11. The semiconductor device of claim 10, wherein the conductive protection structure comprises tungsten.

12. The semiconductor device of claim 10, wherein the conductive protection structure is between the bottom surface of the second via structure and the top surface of the first metallization structure.

13. The semiconductor device of claim 10,
wherein the conductive protection structure is a substantially flat structure.

14. The semiconductor device of claim 10,
wherein the first ILD layer includes a material that is: a silicon oxide material, a low dielectric constant (low-k) material, or a combination thereof.

15. A semiconductor device, comprising:
a substrate;
a conductive feature in the substrate;
a first interlayer dielectric (ILD) layer over the conductive feature and the substrate;
a first via structure in the first ILD layer;
a first barrier layer in the first ILD layer and surrounding the first via structure;
a second barrier layer, surrounding a first conductive structure, in contact with the first via structure, the first conductive structure comprising a first metallization structure;
a second ILD layer in contact with the second barrier layer and the first conductive structure, wherein the second ILD layer is a single layer formed of a material that is a silicon oxide or a low dielectric constant (low-k) material;
a conductive protection structure in the second ILD layer, wherein a top surface of the first metallization structure is in contact with the conductive protection structure and the second ILD layer;
a third barrier layer extending through at least part of the second ILD layer to intersect with a top surface of the conductive protection structure; and
a second via structure comprising a conductive material in the second ILD layer and surrounded by the third barrier layer
wherein, from a side view of the semiconductor device, the second via structure is narrower than the conductive protective structure, and the conductive protection structure is narrower than the first metallization structure,
wherein an entirety of a side surface of the second via structure is in direct contact with the third barrier layer, an entirety of a bottom surface of the second via structure is in direct contact with the third barrier layer, an entirety of a top surface of the second via structure is in direct contact with a fourth barrier layer, and an entirety of a bottom surface of a second metallization structure is in direct contact with the fourth barrier layer,
wherein the second metallization structure is above the second via structure, and wherein the bottom surface of the second metallization structure is wider than the top surface of the second via structure,
wherein the first metallization structure, the conductive protection structure, the first via structure, and the second via structure are vertically aligned with respect to one another and each has a width,
wherein the width of the second via structure is smaller than and contained within the width of the conductive protection structure, and
wherein the width of the conductive protection structure is smaller than and contained within the width of the first metallization structure.

16. The semiconductor device of claim 15,
wherein the conductive protection structure comprises tungsten.

17. The semiconductor device of claim 15,
wherein the conductive protection structure is between the bottom surface of the second via structure and the top surface of the first metallization structure.

18. The semiconductor device of claim 15,
wherein the first ILD layer includes a material that includes: a silicon oxide material, a low dielectric constant (low-k) material, or a combination thereof.

19. The semiconductor device of claim 15,
wherein the conductive protection structure is a substantially flat structure.

20. The semiconductor device of claim 15, wherein:
a first portion of the first metallization structure resides between a first side of the first metallization structure and a first side of the conductive protection structure, and
a second portion of the first metallization structure resides between a second side of the first metallization structure and a second side of the conductive protection structure.

* * * * *